United States Patent [19]
Kinose

[11] Patent Number: 5,915,396
[45] Date of Patent: Jun. 29, 1999

[54] SUBSTRATE PROCESSING APPARATUS

[75] Inventor: Kazuo Kinose, Shiga-ken, Japan

[73] Assignee: Dainippon Screen Manufacturing Co., Ltd., Japan

[21] Appl. No.: 08/881,920

[22] Filed: Jun. 25, 1997

[30] Foreign Application Priority Data

Jun. 28, 1996 [JP] Japan .................................. 8-170204

[51] Int. Cl.⁶ .................................................. B08B 3/02
[52] U.S. Cl. ........................... 134/61; 134/76; 134/902; 414/222
[58] Field of Search ............................. 134/61, 78, 76, 134/902; 414/222

[56] References Cited

U.S. PATENT DOCUMENTS

| | | | |
|---|---|---|---|
| 4,936,328 | 6/1990 | Yatabe | 134/76 |
| 4,985,722 | 1/1991 | Ushijima et al. | 134/66 |
| 5,024,315 | 6/1991 | Ward | 414/222 |
| 5,158,616 | 10/1992 | Kinoshita et al. | 134/902 |
| 5,314,509 | 5/1994 | Kato et al. | 134/902 |
| 5,578,127 | 11/1996 | Kimura | 134/902 |
| 5,603,777 | 2/1997 | Ohashi | 134/66 |

FOREIGN PATENT DOCUMENTS

| | | | |
|---|---|---|---|
| 4-332128 | 11/1992 | Japan | 134/902 |
| 7-245285 | 9/1995 | Japan . | |

*Primary Examiner*—Frankie L. Stinson
*Attorney, Agent, or Firm*—Ostrolenk, Faber, Gerb & Soffen, LLP

[57] ABSTRACT

A substrate processing apparatus is provided which requires a reduced installation space and allows for ready change of a process order. A substrate processing apparatus includes: a first transportation mechanism movable along a first transportation path in a predetermined transportation direction; a cassette load portion provided on one side of the transportation path; a plurality of unit portions arranged in a direction crossing the transportation direction on the other side of the first transportation path; and a second transportation mechanism disposed between each two adjacent unit portions and movable along a second transportation path in the transportation direction. The first transportation mechanism can perform a substrate transferring operation with respect to a cassette placed on the cassette load portion and a processing unit in a unit portion disposed in closest proximity to the first transportation path among the plurality of unit portions. The second transportation mechanism can perform a substrate transferring operation with respect to any processing units included in unit portions disposed on opposite sides of the second transportation path.

15 Claims, 15 Drawing Sheets

F I G. 1
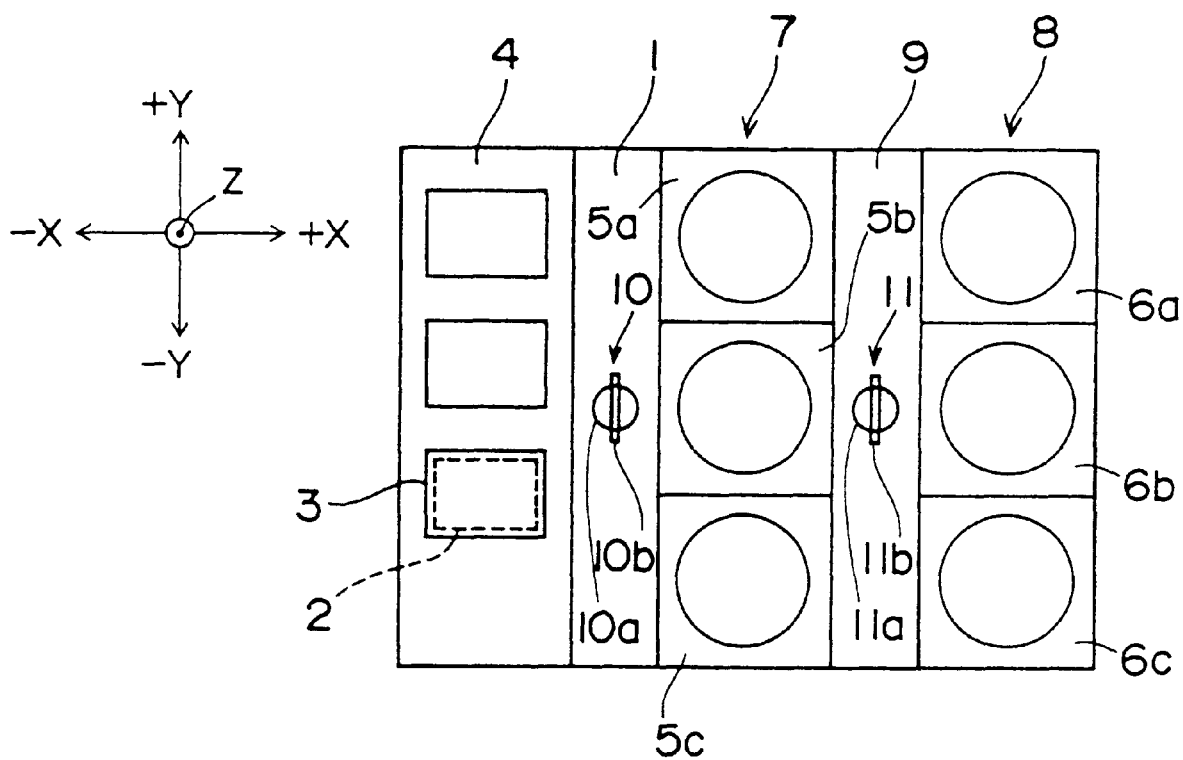

F I G. 4
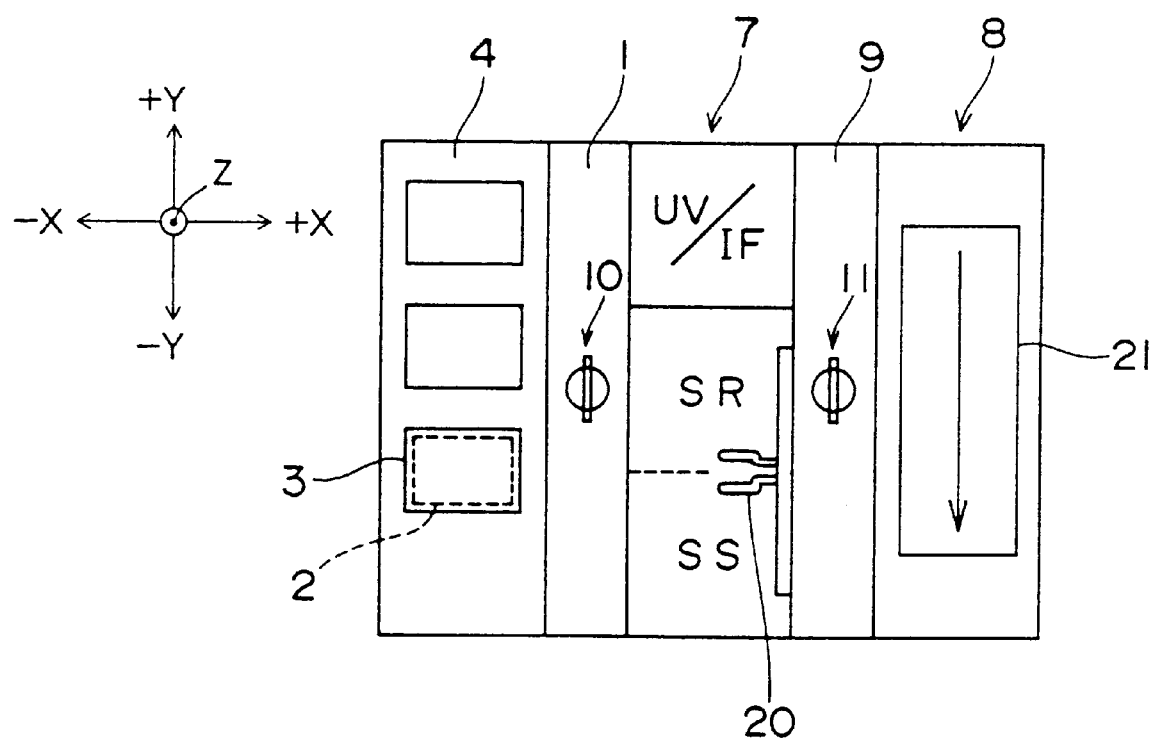

SUBSTRATE PROCESSING APPARATUS

BACKGROUND OF THE INVENTION

1. Field of the Invention

The present invention relates to a substrate processing apparatus for treating the surface of a substrate such as an LCD (liquid crystal display) glass substrate, a PDP (plasma display panel) glass substrate or a semiconductor wafer, and the substrate processing apparatus is applicable to the fabrication of LCDs, PDPs, semiconductor devices and the like.

2. Description of the Related Art

Fabrication processes for LCDs, PDPs and ICs (integrated circuits) include the step of forming electronic circuits on a substrate such as a glass substrate or a wafer. A special-purpose substrate processing apparatus is used for the formation of electronic circuitry on a substrate. A substrate processing apparatus of this type generally has a plurality of units including a unit for cleaning the surface of a substrate and a unit for patterning a metal film on the surface of the substrate.

One exemplary construction of such a substrate processing apparatus is of a sequential transportation type, which is shown in plan in FIG. 15. The apparatus of the sequential transportation type has a loader L to be loaded with a cassette 101 holding a plurality of untreated substrates 100, a plurality of processing units S, and an unloader U to be loaded with a cassette 102 for storing treated substrates 100. The loader L, the processing units S and the unloader U are linearly arranged in the X direction in this order.

One of the substrates 100 held in the cassette 101 placed on the loader L is carried out by means of a carry-out robot 103, and transferred to a transportation robot R disposed adjacent to the carry-out robot 103 on the +X side thereof. The transportation robot R transfers the substrate 100 to a processing unit S disposed adjacent to the transportation robot 103 on the +X side thereof. The substrate 100 treated by the processing unit S is carried out by a second transportation robot R disposed adjacent to the processing unit S on the +X side thereof and, transferred to a second processing unit S disposed adjacent to the second transportation robot R on the +X side thereof. Thus, the substrate 100 is subjected to a series of processes while being sequentially transported in the +X direction. Finally, the substrate 100 is transferred to a carry-in robot 104, and brought into the cassette 102 placed on the unloader U by means of the carry-in robot 104.

However, the apparatus of the sequential transportation type has a great length as measured in the X direction, because the processing units S are linearly arranged with the transportation robots R interposed therebetween. Therefore, if a greater number of processing units S are to be provided in the apparatus, a much greater floor area is required for the installation of the apparatus.

Further, since the arrangement order of the processing units absolutely determines the process order in which one substrate is subjected to a plurality of processes, it is difficult to change the process order.

SUMMARY OF THE INVENTION

It is an object of the present invention to provide a substrate processing apparatus which requires a reduced floor area for the installation thereof.

It is another object of the present invention to provide a substrate processing apparatus which allows for ready change of the process order.

The substrate processing apparatus of the present invention includes: a first transportation mechanism movable along a first transportation path in a predetermined transportation direction and capable of performing a substrate transferring operation at any of plural points on the first transportation path; a cassette load portion provided on one side of the first transportation path and adapted to be loaded with a cassette for holding a substrate; a plurality of unit portions arranged in a direction crossing the transportation direction on the other side of the first transportation path and each including a processing unit for subjecting a substrate to a predetermined process; and a second transportation mechanism disposed between each two adjacent unit portions, the second transportation mechanism movable along a second transportation path in the transportation direction and capable of performing a substrate transferring operation at any of plural points on the second transportation path. The first transportation mechanism can perform the substrate transferring operation with respect to the cassette on the cassette load portion and a processing unit in a unit portion disposed in closest proximity to the first transportation path among the plurality of unit portions. The second transportation mechanism can perform the substrate transferring operation with respect to any processing units included in unit portions disposed on opposite sides of the second transportation mechanism.

At least one unit portion may include a plurality of processing units arranged in the transportation direction.

In the present invention, the first and second transportation mechanisms can perform the substrate transferring operation with respect to a processing unit at any of the plural points on the first and second transportation paths. Thus, where a plurality of processing units are arranged in the transportation direction in one unit portion, for example, the processing unit access order for substrate transfer can be set as desired.

If a greater number of processing units are incorporated in the apparatus, unit portions each including a plurality of processing units arranged in the predetermined transportation direction may be arranged in a direction perpendicular to the transportation direction. Therefore, the length of the apparatus can be reduced in comparison with the case where all the processing units are linearly arranged.

Thus, the first transportation mechanism and the second transportation mechanism can each access any processing unit in any unit portion at any of the plural points on the corresponding transportation path. Therefore, the substrate processing order can be set as desired, and readily be changed. The direction of the arrangement of the plurality of processing units is perpendicular to the direction of the arrangement of the plurality of unit portions, and the plurality of unit portions are arranged in a parallel relation. Therefore, the length of the apparatus can be reduced in comparison with the case where all the processing units are linearly arranged. Thus, the apparatus can be made compact, requiring a reduced installation space.

In accordance with one embodiment of the present invention, the apparatus further includes: a cassette storage portion disposed on the distal side, with respect to the cassette load portion, of a unit portion which is most distant from the cassette load portion among the plurality of unit portions, and adapted to be loaded with a cassette for storing a substrate; and a third transportation mechanism disposed between the most distant unit portion and the cassette storage portion, the third transportation mechanism movable along a third transportation path in the transportation direction and capable of performing a substrate transferring operation with respect to a processing unit included in the most distant unit portion and the cassette placed on the cassette storage portion at any of plural points on the third transportation path.

With this arrangement, the cassette load portion and the cassette storage portion are respectively provided on the opposite ends of the substrate processing apparatus. If the cassette load portion is exclusively used for substrate ejection and the cassette storage portion is exclusively used for substrate storage, a substrate carry-in port and a substrate carry-out port can be separately provided in the substrate processing apparatus. This arrangement is suitable for automatically carrying a substrate into and out of a clean room. Further, this arrangement improves the productivity of substrates in comparison with an arrangement of a uni-cassette type which is adapted to put a treated substrate back to the original cassette.

The processing units may include a load unit on which a substrate is to be temporarily placed. With this arrangement, a substrate can be transferred between the first transportation mechanism and the second transportation mechanism by once placing the substrate on the load unit. A space for the transfer of a substrate can be provided in a unit portion. Therefore, the productivity of substrates can be improved.

In accordance with another embodiment of the present invention, the plurality of unit portions include a proximal unit portion disposed in closest proximity to the cassette load portion, and a heat treatment unit portion disposed in a position more distant from the cassette load portion than the proximal unit portion and including a heat treatment unit for subjecting a substrate to a heat treatment.

When a substrate is heat-treated in the heat treatment unit, the ambient temperature around the heat treatment unit becomes unstable. This may adversely influence the substrates on the cassette load portion. Therefore, the heat treatment unit for performing the heat treatment is preferably disposed in a position distant from the cassette load portion, so that the ambient temperature around the cassette load portion can be kept stable. With this arrangement, the proximal unit portion disposed in closest proximity to the cassette load portion does not include the heat treatment unit; therefore, the ambient temperature around the cassette load portion can be kept stable. Thus, the quality of the substrates can be properly maintained.

The plurality of unit portions may include a proximal unit portion disposed in closest proximity to the cassette load portion, and a chemical treatment unit portion disposed in a position more distant from the cassette load portion than the proximal unit portion and including a chemical treatment unit for subjecting a substrate to a chemical treatment.

When a substrate is treated with a chemical in the chemical treatment unit, the mist of the chemical is contained in ambient air. If the air containing the chemical mist diffuses to the cassette load portion, the substrates may be contaminated with the chemical. Therefore, the chemical treatment unit for performing the chemical treatment is preferably disposed in a position distant from the cassette load portion. This arrangement can prevent the chemical mist from influencing the substrates on the cassette load portion to some extent. Thus, the substrates on the cassette load portion can be prevented from being contaminated with the chemical mist, whereby the quality of the substrates can be properly maintained.

In accordance with still another embodiment of the present invention, the apparatus further includes a screening mechanism for preventing the cassette load portion from being influenced by an environmental change which may occur when a substrate is subjected to a process in a processing unit in any of the unit portions.

As previously described, the ambient temperature becomes unstable when a substrate is subjected to the heat treatment, and the chemical mist is contained in the ambient air when the substrate is subjected to the chemical treatment. That is, the environment is changed.

With this arrangement, the screening mechanism is provided to absolutely prevent the cassette load portion from being influenced by the environmental change. Thus, the substrates on the cassette load portion can assuredly be prevented from being influenced by the heat and the chemical mist. Therefore, the substrates on the cassette load portion can be kept in a more stable environment, whereby the quality of the substrates can be maintained at a higher level.

The screening mechanism may be provided, for example, between the unit portion including the heat treatment unit or the chemical treatment unit and the first or second transportation mechanism disposed on the closer side to the cassette load portion than the unit portion. Usable as the screening mechanism may be a shutter and a wall.

The foregoing and other objects, features and effects of the present invention will become more apparent from the following description of the preferred embodiments with reference to the attached drawings.

BRIEF DESCRIPTION OF THE DRAWINGS

FIG. 1 is a plan view schematically illustrating the construction of a substrate processing apparatus in accordance with a first embodiment of the present invention;

FIG. 4 is a plan view schematically illustrating the construction of a chemical treatment apparatus in accordance with a third embodiment of the present invention;

DESCRIPTION OF THE PREFERRED EMBODIMENTS

Figure 2:
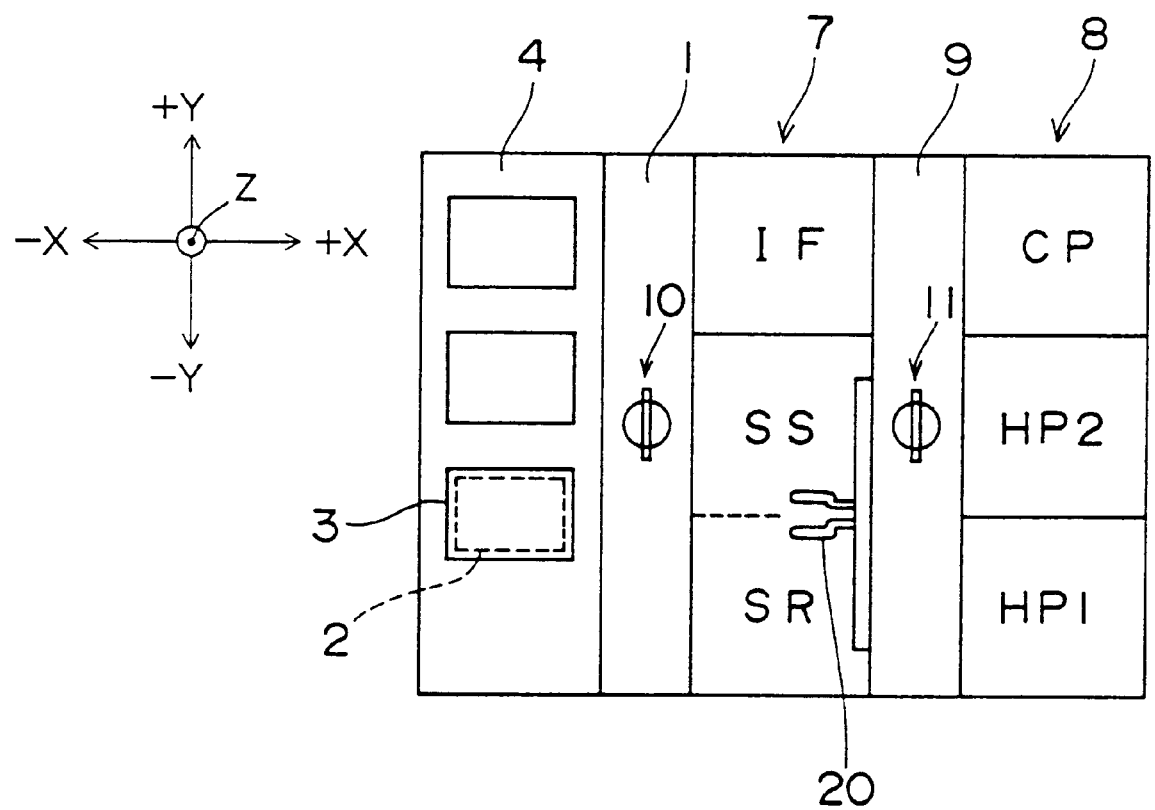
FIG. 2 is a plan view schematically illustrating the construction of a cleaning apparatus in accordance with a second embodiment of the present invention.

FIG. 1 is a plan view schematically illustrating the construction of a substrate processing apparatus in accordance with a first embodiment of the present invention. In FIG. 1, a three-dimensional Cartesian coordinate system is defined with a horizontal plane parallel to a floor being regarded as an X-Y plane and a vertical axis being regarded as a Z axis. More specifically, the +X and −X directions correspond to rightward and leftward directions, respectively, and the +Y and −Y directions correspond to upward and downward directions, respectively, on the paper face of FIG. 1. The +Z and −Z directions correspond to backward and forward directions, respectively, through the paper face of FIG. 1.

The substrate processing apparatus is adapted to subject an LCD glass substrate to various surface treatments. The glass substrate is a mother glass substrate, for example, having dimensions of 550 (mm)×650 (mm). Four LCD panels, for example, can be formed from the mother glass substrate.

The substrate processing apparatus has a first transportation path 1 disposed adjacent to an indexer (IND) 4 on the +X side thereof and extending in a predetermined transportation direction (Y direction). The indexer 4 is adapted to be loaded with a plurality of cassettes 3 each holding a plurality of glass substrates 2. On the +X side of the first transportation path 1, a first unit portion 7 and a second unit portion 8 are arranged in the X direction. The first unit portion 7 and the second unit portion 8 include processing units 5a, 5b, 5c (hereinafter referred to generally as "processing units 5") and processing units 6a, 6b, 6c (hereinafter referred to generally as "processing units 6"), respectively, for treating a glass substrate. Disposed between the first unit portion 7 and the second unit portion 8 is a second transportation path 9 extending in the Y direction like the first transportation path 1.

The processing units 5a, 5b, 5c in the first processing unit portion 7 are arranged in the Y direction, and face both the first transportation path 1 and the second transportation path 9. The processing units 6a, 6b, 6c in the second processing unit portion 8 are arranged in the Y direction so as to face the second transportation path 9.

The glass substrates 2 to be subjected to the surface treatments in the substrate processing apparatus, which are held in a cassette 3 having a plurality of retainer spaces, are transported to and placed on the indexer 4 by means of an AGV (automated guided vehicle) not shown.

By way of example, the processing units 5 and 6 include processing units for performing an ultraviolet radiation process for dry-cleaning a glass substrate 2 with ultraviolet radiation, a spin scrubbing process for wet-cleaning a glass substrate 2 with water or a cleaning chemical while the substrate is rotated, a spin coating process for coating a glass substrate 2 with a resist while the substrate is rotated, and the like. The processing units 5 further include a load unit for temporarily placing a glass substrate 2 thereon. In the first embodiment, the processing unit 5a corresponds to the load unit.

A first transportation robot 10 and a second transportation robot 11 are provided on the first transportation path 1 and the second transportation path 9, respectively. The first transportation robot 10 performs a glass substrate transfer operation with respect to the cassettes 3 placed on the indexer 4 and the processing units 5 in the first unit portion 7. The second transportation robot 11 performs a glass substrate transfer operation with respect to the processing units 5 and 6 in the first unit portion 7 and the second unit portion 8.

Guide rails (not shown) are provided along the Y direction on floor faces of the first transportation path 1 and the second transportation path 9. The respective transportation robots 10 and 11 are movably mounted on the guide rails.

Thus, the first transportation robot 10 is movable in the Y direction. Therefore, the first transportation robot 10 can freely access any of the cassettes 3 on the indexer 4 as well as any of the processing units 5 in the first unit portion 7.

Similarly, the second transportation robot 11 is movable in the Y direction; therefore, the second transportation robot 11 can freely access any of the processing units 5 and 6 in the first unit portion 7 and the second unit portion 8.

The transportation robots 10 and 11 respectively include robot bodies 10a and 11a and arms 10b and 11b attached to the robot bodies 10a and 11a. The arms 10b and 11b can be stretched and rotated in the X-Y plane and moved up and down in the Z direction. The arms 10b and 11b each have a suction mechanism (not shown) provided at a distal end thereof for vacuum-sucking a glass substrate 2. The construction of the transportation robots 10 and 11 is conventionally known and disclosed, for example, in Japanese Unexamined Patent Publication(KOKAI) No. 7-245285 (1995).

Next, the operation of the substrate processing apparatus will be described in detail. The first transportation robot 10 travels in the Y direction to the front of one of the cassettes 3 holding a glass substrate 2 to be treated. Then, the arm 10a of the robot 10 is moved up to a height of a retainer space in which the glass substrate 2 is held, and positioned at this height. Subsequently, the arm 10a is stretched around the center of the glass substrate 2, and slightly moved up to vacuum-suck the glass substrate 2 by means of the suction mechanism thereof. Then, the arm 10a is retracted. Thus, the glass substrate 2 is carried out of the cassette 3.

The first transportation robot 10 then travels in the Y direction to the front of a predetermined processing unit 5 of the first unit portion 7, and stretches the arm 10a to move the glass substrate 2 into the processing unit 5.

At this time, if the glass substrate 2 is to be first subjected to a process in a processing unit 5 included in the first unit portion 7, the glass substrate 2 is carried into the processing unit 5, in which the glass substrate 2 is subjected to the first predetermined process.

Conversely, if the glass substrate 2 is to be first subjected to a process in a processing unit 6 not included in the first unit portion 7 but in the second unit portion 8, it is necessary to transfer the glass substrate 2 from the first transportation robot 10 to the second transportation robot 11. However, the first and second transportation robots 10 and 11 are not constructed such that a glass substrate 2 can be transferred directly from the first transportation robot 10 to the second transportation robot 11 and vice versa. Therefore, the first transportation robot 10 carries the glass substrate 2 into the load unit 5a, and the second transportation robot 11, in turn, carries the glass substrate 2 out of the load unit 5a into the processing unit 6 for the first process. Then, the glass substrate 2 is subjected to the first predetermined process.

The treated glass substrate 2 is transported to a processing unit for the next process. If the processing unit for the first process and the processing unit for the next process are included in the same unit portion, the glass substrate 2 is carried out of the processing unit for the first process, then transported in the Y direction and carried into the processing unit for the next process by the first transportation robot 10 or the second transportation robot 11.

Conversely, if the processing unit for the first process and the processing unit for the next process are included in different unit portions, the glass substrate 2 is transported from the unit for the first process to the load unit 5a by the first transportation robot 10 or the second transportation robot 11, and carried into the load unit 5a. Then, the glass substrate 2 is carried out of the load unit 5a, then transported in the Y direction to the front of the next processing unit, and carried into the next processing unit by the first transportation robot 10 or the second transportation robot 11.

It should be noted, however, the second transportation robot 11 can access the units of both the first and second processing unit portions 7 and 8. Thus, the second transportation robot 11 may carry a substrate out of a unit in the first processing unit portion 7, and then transport the substrate to carry it into a unit in the second processing unit portion 8.

Where the second transportation robot 11 is busy when a unit in the first processing unit portion 7 has completed its processing to a substrate, it is preferable that the first transportation robot 10 carries the substrate out of the unit to put it into the load unit 5a. Thereafter, the second unit 8 will access the load unit 5a to carry out the substrate therefrom at an arbitrary timing, and then carry it into a unit in the second processing unit portion 8. This operation manner of the robots 10 and 11 improves the productivity of substrates.

Operations as described above are repeatedly performed until a series of processes is completed. If the last process is performed in a processing unit 5 included in the first unit portion 7, the glass substrate 2 is carried out of the processing unit 5 by the first transportation robot 10. Conversely, if the last process is performed in a processing unit 6 included in the second unit portion 8, the glass substrate 2 is carried out of the processing unit 6 into the load unit 5a by the second transportation robot 11, and then carried out of the load unit 5a by the first transportation robot 10.

Thereafter, the first transportation robot 10 travels in the Y direction to the front of the cassette 3 in which the treated glass substrate 2 is originally retained. Then, the arm 10a is moved in the Z direction to the altitude of the original retainer space, and positioned at this altitude. In turn, the arm 10a is stretched, and slightly lowered to return the treated glass substrate 2 to the original retainer space. Then, the first transportation robot 10 retracts the arm 10a out of the cassette 3.

In accordance with this embodiment, the transportation robots 10 and 11 are each movable in the Y direction along the arrangement of the processing units 5 and 6 and, hence, can freely access any of the processing units 5 and 6. Since the access order of the processing units 5 and 6 into which the glass substrate 2 is to be transported can readily be changed, the process order for the glass substrate 2 can be set as desired.

Further, the unit portions 7 and 8 are arranged in the X direction in a parallel relation and, hence, the length of the apparatus can be reduced in comparison with the case where the processing units are linearly arranged. Therefore, the apparatus can be made compact.

Since the load unit 5a is included in the first unit portion 7, the glass substrate 2 can be transferred from the first transportation robot 10 to the second transportation robot 11 via the load unit 5a and vice versa. Therefore, the transfer of the glass substrate 2 does not require the timing control of the action of the first transportation robot 10 and the second transportation robot 11, thereby improving the productivity of substrates. Further, the process order for the glass substrate 2 can readily be changed, for example, by allowing a glass substrate 2 to be subjected to the first process in a processing unit 6 in the second unit portion 8.

The opposite ends of the transportation paths 1 and 9 extending in the Y direction are each open to a space outside the substrate processing apparatus. Therefore, the maintenance of the transportation robots 10 and 11 can readily be performed, thereby increasing the lifetimes of the transportation robots 10 and 11.

Where additional processing units are to be provided in the apparatus, an additional unit portion including these processing units are disposed on the +X side of the unit portion 8, and an additional transportation path extending in the Y direction is provided between the additional unit portion and the unit portion 8. A third transportation robot is adapted to travel along the additional transportation path. Therefore, there is no need to extend the travel distance of the respective transportation robots 10 and 11, so that the lifetimes of the transportation robots can be increased. Further, there is no need to increase the lengths of cables and pipes for transmitting driving forces to the transportation robots, thereby facilitating the cabling and piping arrangement.

The transportation paths 1 and 9 have substantially the same configuration and the transportation robots 10 and 11 have substantially the same construction. Even if a greater number of processing units are to be provided in the apparatus, the apparatus can be fabricated on the same design basis, so that the number of design processes and the production costs can be reduced.

FIG. 2 is a plan view schematically illustrating the construction of a cleaning apparatus in accordance with a second embodiment of the present invention. In FIG. 2, like reference characters used in FIG. 1 denote like functional components.

The cleaning apparatus is adapted to subject a glass substrate 2 to a cleaning process. The first unit portion 7 and the second unit portion 8 respectively include the following processing units.

The first unit portion 7 includes a load unit IF, a spin scrubber SS for washing a glass substrate 2 with water, and a spin dryer SR for drying the water-washed glass substrate 2. The second unit portion 8 includes hot-plate-type heater units HP1 and HP2 for heating a glass substrate 2, and a cool-plate-type cooler unit CP for cooling the heated glass substrate 2.

Thus, the units for the heat treatment are not included in the first unit portion 7 disposed in closest proximity to the indexer 4, but in the second unit portion 8. This arrangement prevents the indexer 4 from being influenced by the heat from the heat treatment units. As a result, untreated or treated glass substrates 2 held in the cassettes 3 on the indexer 4 can be kept in an environment at a generally constant temperature, so that the quality of the glass substrates 2 can properly be maintained.

In this embodiment, a special arm 20 for directly transporting a glass substrate 2 from the spin scrubber SS to the spin dryer SR is provided for reciprocal movement in the Y direction between the spin scrubber SS and the spin dryer SR. If the apparatus were designed so as to transport a wet glass substrate 2 washed with water by the spin scrubber SS to the spin dryer SR by the first transportation robot 10, water dripping on the first transportation robot 10 would contaminate a glass substrate 2 to be next transported by the robot 10. The use of the special arm 20 for the transportation of the glass substrate 2 from the spin scrubber SS to the spin dryer SR prevents the contamination of the glass substrate 2.

Figure 3:
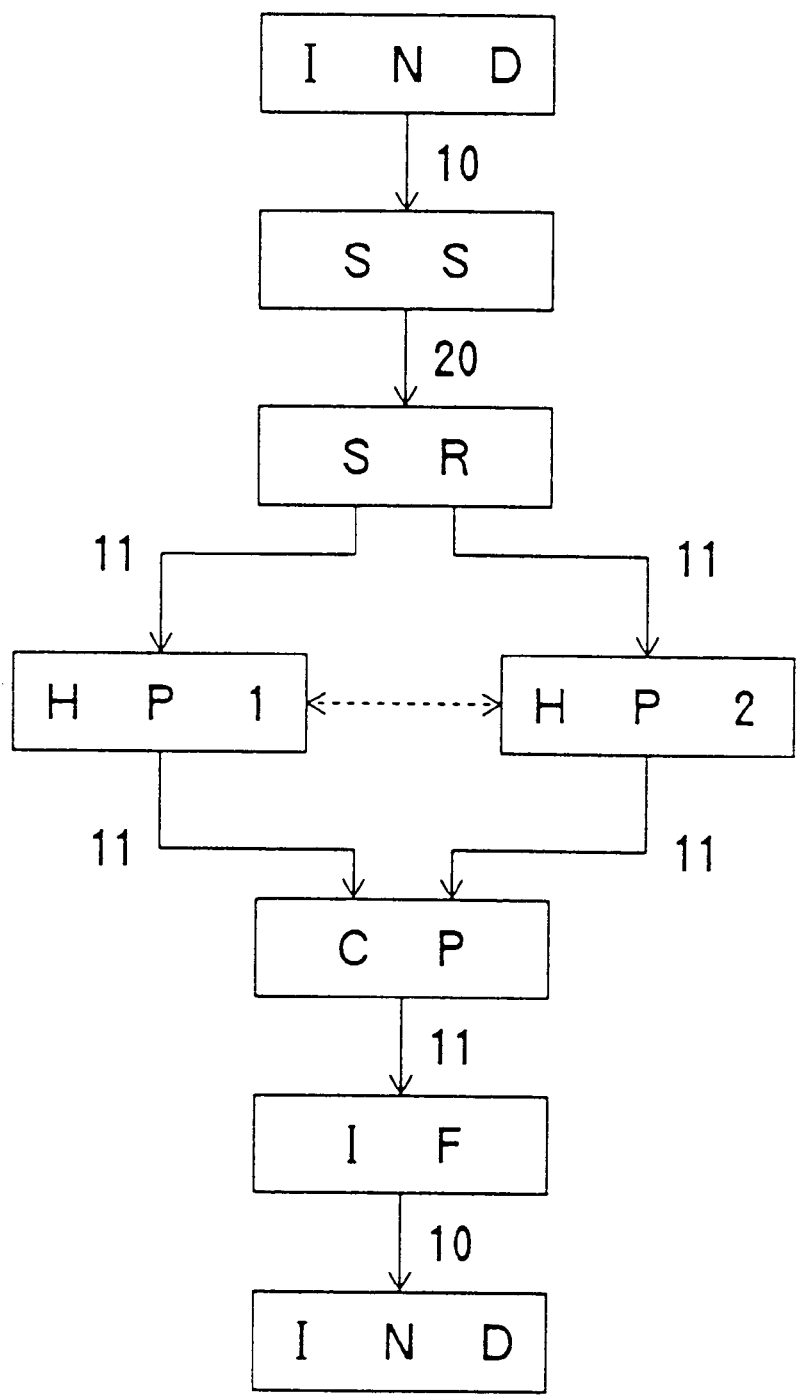
FIG. 3 is a flow chart for explaining the flow of the operation of the cleaning apparatus.

FIG. 3 is a flow chart for explaining the flow of the operation of the cleaning apparatus. It is herein defined that the reference numerals appended to the arrows in FIG. 3 each correspond to the reference numeral of a transportation robot for transporting a glass substrate 2 from a unit indicated by an arrow tail to a unit indicated by an arrow head. The same definition is applied to FIGS. 5, 7, 9 and 11 to be described later.

The first transportation robot 10 carries out a glass substrate 2 from one of the cassettes 3 placed on the indexer 4, and travels to the front of the spin scrubber SS. In turn, the robot 10 carries the glass substrate 2 into the spin scrubber SS. Thus, the glass substrate 2 is washed with water in the spin scrubber SS.

Since the water-washed glass substrate 2 is usually wet, the glass substrate 2 is carried into the spin dryer SR and dried. At this time, the water-washed glass substrate 2 is transported to the spin dryer SR not by the first transportation robot 10 but by the special arm 20, as previously described.

The dried glass substrate 2 is carried out of the spin dryer SR into either one of the heater units HP1 and HP2 by the second transportation robot 11 and heated. If a glass substrate 2 is already carried into one of the heater units HP1 and HP2, the glass substrate 2 to be next subjected to the heat treatment is carried into the other heater unit. Thus, the productivity of substrates can be improved.

Alternatively, the glass substrate 2 may be subjected to the heat treatment twice by first subjecting the glass substrate 2 to the heat treatment in the heater unit HP1 and then carrying the glass substrate 2 into the heater unit HP2.

After the heat treatment, the glass substrate 2 is carried out of the heater unit HP1 or HP2 into the cooler unit CP by the second transportation robot 11 and cooled. Thus, all the processes for the glass substrate 2 in the cleaning apparatus are completed.

After the completion of the processes, the glass substrate 2 is returned to a retainer space of the cassette 3 in which the substrate has originally been retained. More specifically, the glass substrate 2 subjected to all the processes is carried out of the cooler unit CP by the second transportation robot 11, and then placed on the load unit IF. Thereafter, the first transportation robot 10 carries the glass substrate 2 out of the load unit IF, then transports the glass substrate 2 to the front of the original cassette 3, and inserts the substrate 2 into the cassette 3.

This operation flow is merely illustrative and, hence, may be modified as required.

FIG. 4 is a plan view schematically illustrating the construction of a chemical treatment apparatus in accordance with a third embodiment of the present invention. In FIG. 4, like reference characters used in FIG. 1 denote like functional components.

The chemical treatment apparatus is adapted to clean a glass substrate 2 with a chemical. The first unit portion 7 and the second unit portion 8 respectively include the following processing units.

The first unit portion 7 includes a load unit IF and an ultraviolet radiation unit UV which are stacked one on the other, a spin dryer SR and a spin scrubber SS. On the other hand, the second unit portion 8 includes only a chemical treatment unit. Each of the unit portions is not necessarily comprised of a plurality of processing units arranged therein, but may be comprised of a single processing unit.

The chemical treatment unit has a transportation belt 21. In the chemical treatment unit, a glass substrate 2 is subjected to a chemical cleaning process while being transported in the −Y direction by the transportation belt 21. Transportation rollers may be used instead of the transportation belt 21.

In the chemical treatment apparatus, the chemical treatment unit which uses a chemical for the chemical treatment of the glass substrate 2 is disposed only in the second unit portion 8, but not in the first unit portion 7 disposed in closest proximity to the indexer 4. Therefore, the indexer 4 is prevented from being influenced by the mist of the chemical to some extent. This arrangement prevents chemical contamination of untreated and treated glass substrates 2 held in the cassettes 3 on the indexer 4, so that the quality of the glass substrates 2 can be properly maintained.

Figure 5:
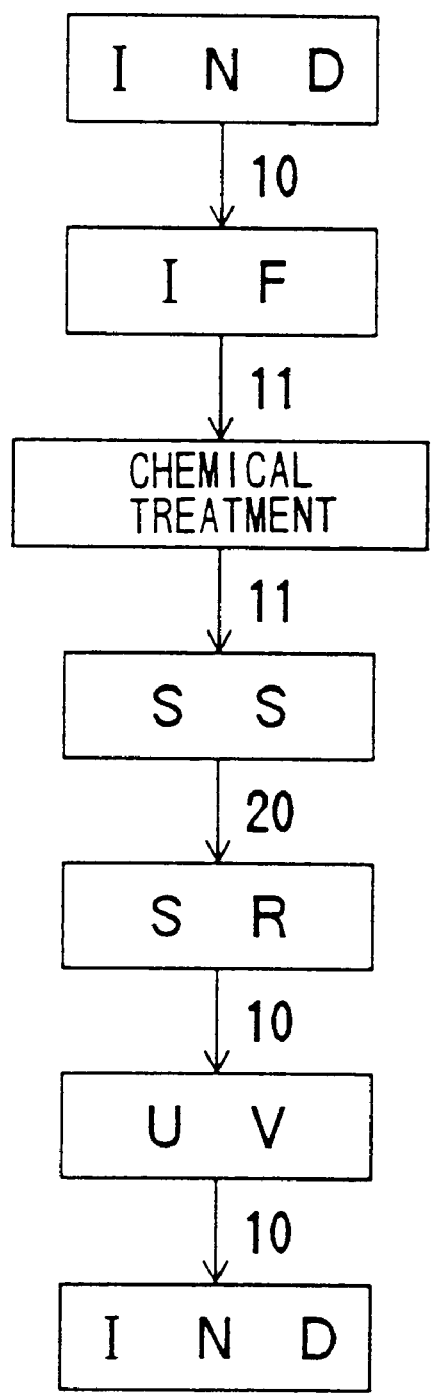
FIG. 5 is a flow chart for explaining the flow of the operation of the chemical treatment apparatus.

FIG. 5 is a flow chart for explaining the flow of the operation of the chemical treatment apparatus. The first transportation robot 10 carries a glass substrate 2 out of one of the cassettes 3 on the indexer (IND) 4, and then places the glass substrate 2 on the load unit IF to transfer the glass substrate 2 to the second transportation robot 11. Thereafter, the second transportation robot 11 carries the glass substrate 2 out of the load unit IF to an end of the transfer belt 21 on the upstream side of the transportation in the chemical treatment unit.

The glass substrate 2 placed on the transportation belt 21 is transported in a transportation direction by the transportation belt 21. During the transportation, the glass substrate 2 is subjected to the chemical treatment. When the glass substrate 2 is transported to the most downstream point of the transportation belt 21, the chemical adheres onto the glass substrate 2. The second transportation robot 11 travels in the Y direction so as to receive the glass substrate 2 to be transported to the downstream end of the transportation belt 21. When the glass substrate 2 is transported to the downstream end of the transportation belt 21, the second transportation robot 11 carries the glass substrate 2 out of the transportation belt 21, then transports the substrate 2 to the front of the spin scrubber SS, and carries the substrate 2 into the spin scrubber SS.

Since the second transportation robot 11 serves to carry out and transport a glass substrate 2 bearing the chemical adhering thereon, the second transportation robot 11 is preliminarily imparted with a chemical resistance. More specifically, the second transportation robot 11 is coated with Teflon.

The glass substrate 2 carried into the spin scrubber SS is rinsed with water for removal of the chemical adhering thereon. After the water rinsing process, water adheres onto the glass substrate 2. Therefore, the glass substrate 2 is transported to the spin dryer SR by the special arm 20 in the same manner as described with reference to FIG. 3, and dried therein.

The dried glass substrate 2 is carried out of the spin dryer SR into the ultraviolet radiation unit UV by the first transportation robot 10 for dry cleaning. After the ultraviolet radiation process, the glass substrate 2 is carried out of the ultraviolet radiation unit UV and transported to the front of the original cassette 3 by the first transportation robot 10, and returned to the cassette 3.

This operation flow is merely illustrative, and may be modified as required.

Figure 6:
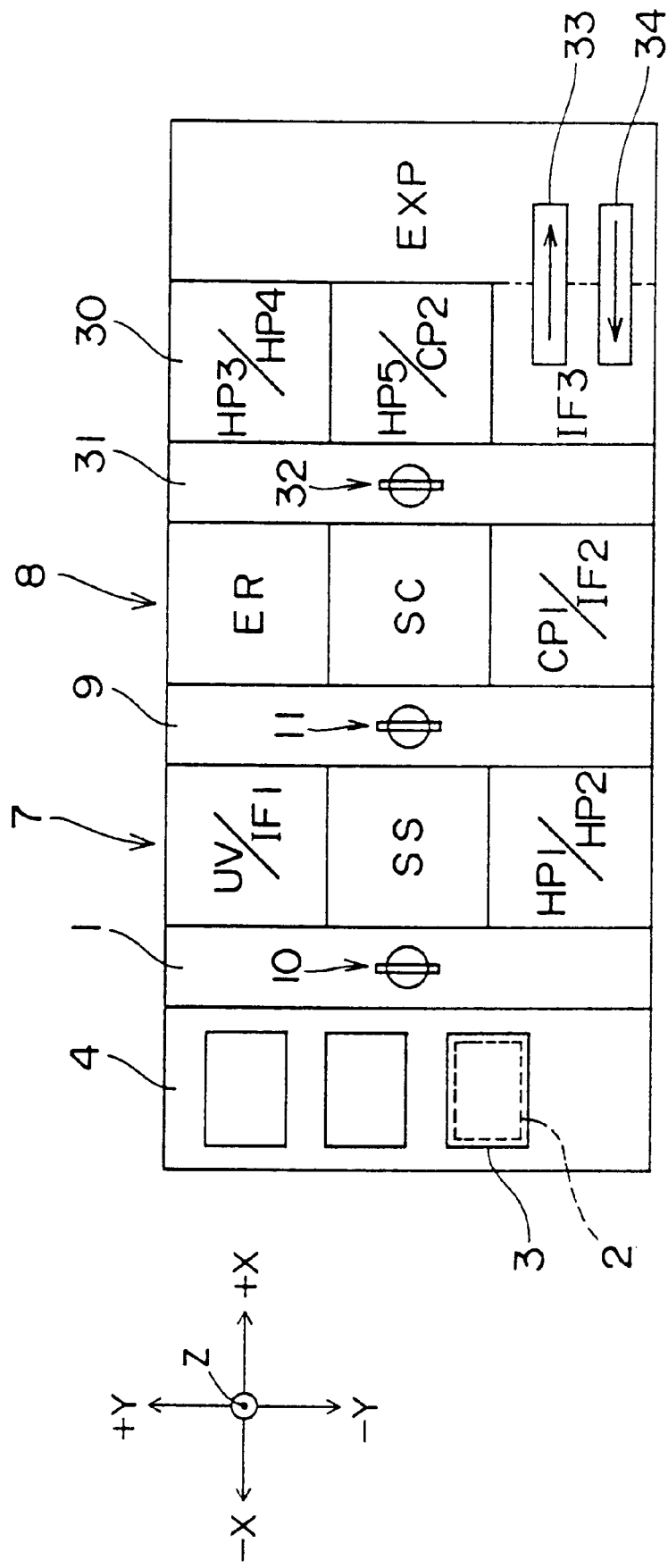
FIG. 6 is a plan view schematically illustrating the construction of an exposure apparatus in accordance with a fourth embodiment of the present invention.

FIG. 6 is a plan view schematically illustrating the construction of an exposure apparatus in accordance with a fourth embodiment of the present invention. In FIG. 6, like reference characters used in FIG. 1 denote like functional components.

The exposure apparatus is adapted to subject a glass substrate 2 to an exposure process. The first unit portion 7 and the second unit portion 8 respectively include the following processing units.

The first unit portion 7 includes a load unit IF1 and an ultraviolet radiation unit UV which are stacked one on the other, a spin scrubber SS, and heater units HP1 and HP2 which are stacked one on the other. The second unit portion 8 includes an end face cleaning unit ER for cleaning end faces of a glass substrate 2, a spin coater SC for applying a resist onto a glass substrate 2, and a load unit IF2 and a cooler unit CP1 which are stacked one on the other.

Where a glass substrate 2 is to be subjected to the exposure process, the processing units in the unit portions 7 and 8 do not suffice for the process; therefore, the exposure apparatus further includes a third unit portion 30, a third transportation path 31 and an exposure unit EXP.

The third unit portion 30 is disposed on the +X side of the second unit portion 8. The third transportation path 31 is disposed between the second unit portion 8 and the third unit portion 30, and provided with a third transportation robot 32 movable in the Y direction. The exposure unit EXP is disposed adjacent to the third unit portion 30 on the +X side thereof.

In the third unit portion 30, heater units HP4 and HP3 which are stacked one on the other, a cooler unit CP2 and a heater unit HP5 which are stacked one on the other, and a load unit 1F3 are arranged in the Y direction. Transportation roller portions 33 and 34 adapted to transport a glass substrate 2 in the +X and -X directions, respectively, are provided between the load unit IF3 and the exposure unit EXP.

The transportation roller portions 33 and 34, though schematically illustrated in FIG. 6, have a plurality of rollers arranged in the X direction and adapted to rotate clockwise and counterclockwise, respectively, as viewed from the -Y side.

Thus, the transportation path 31 having the same construction as the transportation paths 1 and 9, and the unit portion 30 including the processing units arranged in the same manner as in the unit portions 7 and 8 are additionally provided on the +X side to cope with a case where a glass substrate 2 is to be subjected to a greater number of processes.

Figure 7:
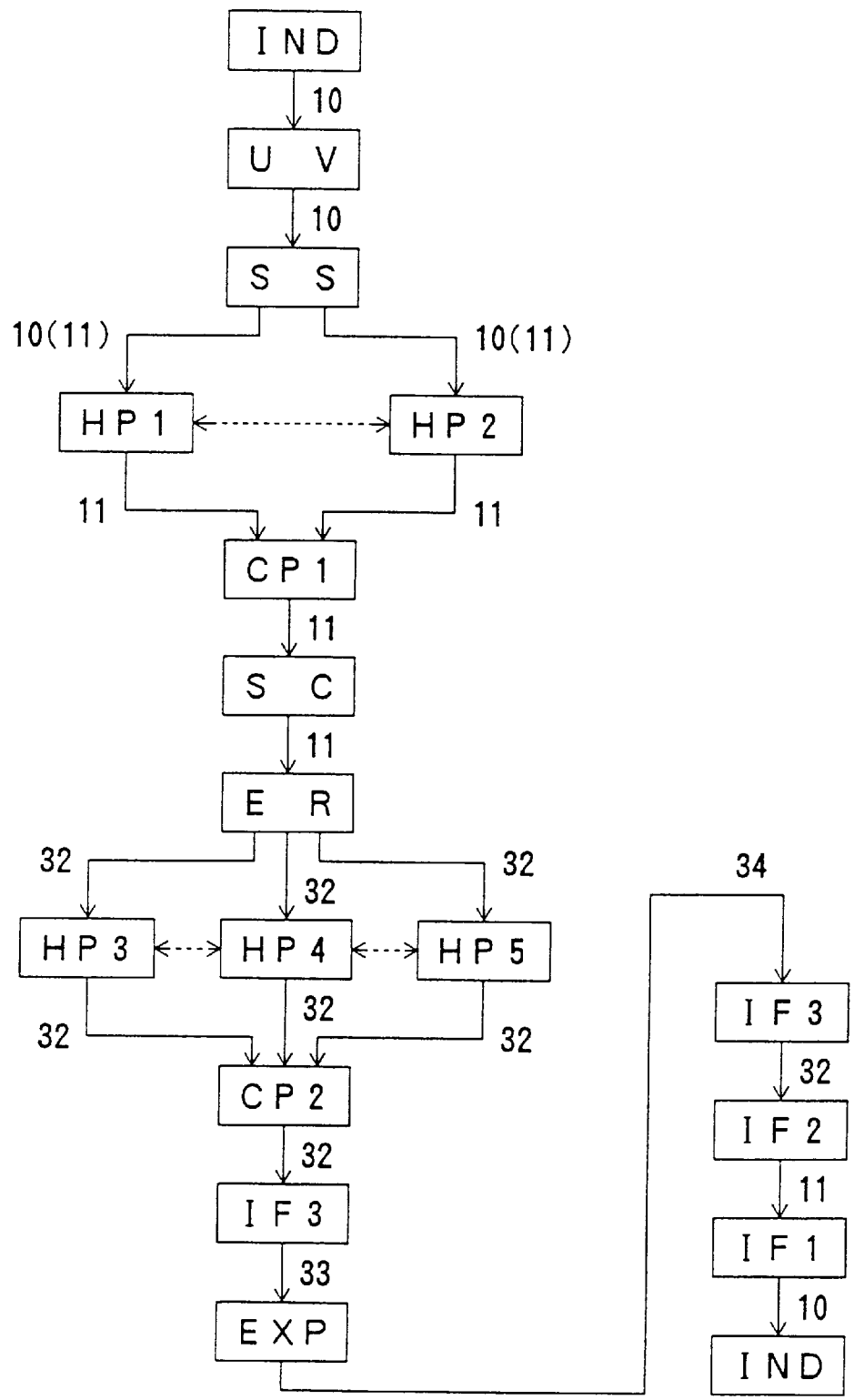
FIG. 7 is a flow chart for explaining the flow of the operation of the exposure apparatus.

FIG. 7 is a flow chart for explaining the flow of the process to be performed in the exposure apparatus. Before a glass substrate 2 is exposed to light, the glass substrate 2 is subjected to a cleaning process in the exposure apparatus.

More specifically, the first transportation robot 10 carries a glass substrate 2 out of one of the cassettes 3 on the indexer (IND) 4 into the ultraviolet radiation unit UV, in which the glass substrate 2 is dry-cleaned. After the ultraviolet radiation process, the glass substrate 2 is carried into the spin scrubber SS, and washed with water therein.

After the water-washing process, the glass substrate 2 is carried out of the spin scrubber SS into the heater unit HP1 or HP2 by the first transportation robot 10 or the second transportation robot 11. Which transportation robot is used for carrying out the glass substrate 2 is determined in consideration of the process order and the productivity of substrates. Where a glass substrate is already carried into one of the heater units HP1 and HP2, the water-washed glass substrate 2 is carried into the other heater unit. Thus, the productivity of substrates can be improved.

After the heating process, the glass substrate 2 is carried out of the heater unit HP1 or HP2 into the cooler unit CP1 by the second transportation robot 11 and cooled. Thereafter, the glass substrate 2 is carried into the spin coater SC, and coated with a resist therein.

After the resist coating process, the glass substrate 2 is carried out of the spin coater SC into the end face cleaning unit ER by the second transportation robot 11, and end faces of the glass substrate 2 are cleaned. More specifically, the resist adhering onto the end faces of the glass substrate 2 is removed.

After the end face cleaning process, the glass substrate 2 is carried out of the end face cleaning unit ER into one of the heater units HP3, HP4 and HP5 by the third transportation robot 32. Where glass substrates are already carried into two of the heater units, the glass substrate 2 is carried into the other heater unit for improvement of the productivity of substrates. After the heating process, the glass substrate 2 is carried out of the heater unit HP3, HP4, or HP5 into the cooler unit CP2 by the third transportation robot 32 and cooled. Thus, the cleaning process and the resist coating process for the glass substrate 2 are completed prior to the exposure process.

Upon the completion of the cleaning process and the resist coating process prior to the exposure process, the glass substrate 2 is carried out of the cooler unit CP2 and then placed onto the upstream end of the transportation roller portion 33 in the load unit IF3 by the third transportation robot 32. As a result, the glass substrate 2 is transported in the +X direction by the transportation roller portion 33, and automatically carried into the exposure unit EXP.

After the exposure process, the glass substrate 2 is returned to the cassette 3 without being subjected to any other processes. More specifically, the light-exposed glass substrate 2 is placed on the upstream end of the transportation roller portion 34. As a result, the glass substrate 2 is transported in the -X direction by the transportation roller portion 34, and automatically carried into the load unit IF3. Thereafter, the glass substrate 2 is carried into the load unit IF2 by the third transportation robot 32. Subsequently, the glass substrate 2 is carried into the load unit IF1 by the second transportation robot 11, and returned into the cassette 3 by the first transportation robot 10.

This operation flow is merely illustrative, and may be modified as required.

Figure 8:
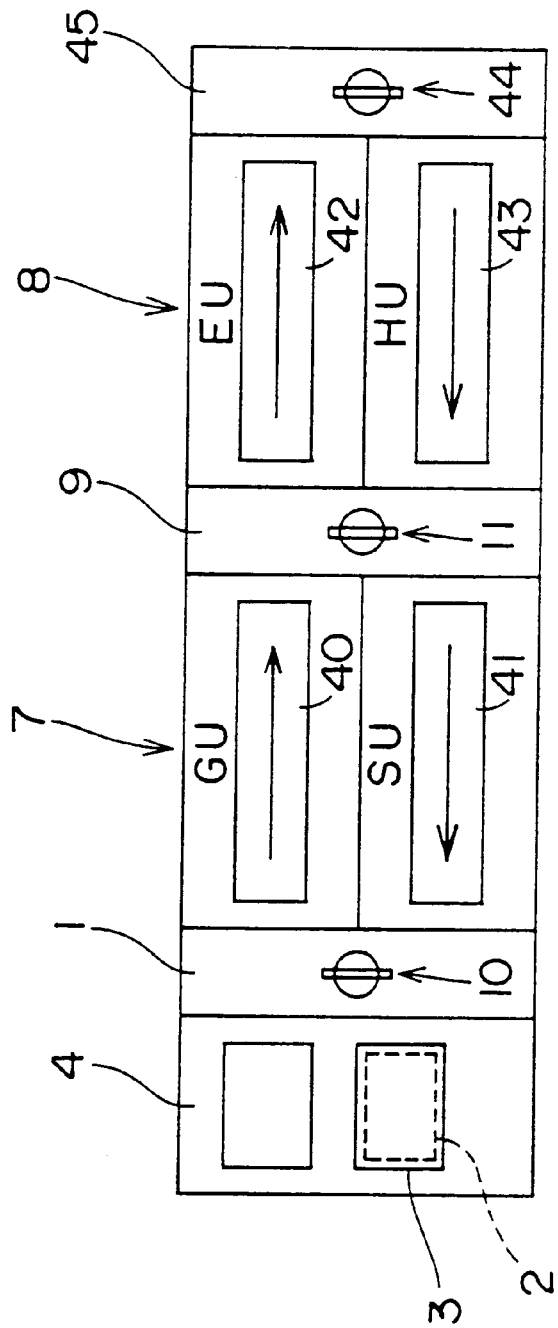
FIG. 8 is a plan view schematically illustrating the construction of a patterning apparatus in accordance with a fifth embodiment of the present invention.

FIG. 8 is a plan view schematically illustrating the construction of a patterning apparatus in accordance with a fifth embodiment of the present invention. In FIG. 8, like reference characters used in FIG. 1 denote like functional components.

The patterning apparatus is adapted to subject a glass substrate 2 to a patterning process after the exposure process. The first unit portion 7 and the second unit portion 8 respectively include the following processing units.

The first unit portion 7 includes a developing unit GU for subjecting a glass substrate 2 to a developing process, and a cleaning unit SU for cleaning a glass substrate 2 after a photoresist and a metal film are removed. The developing unit GU has transportation roller portion 40 for transporting a glass substrate 2 only in the +X direction. The cleaning unit SU has transportation roller portion 41 for transporting a glass substrate 2 only in the −X direction.

The second unit portion 8 includes an etching unit EU for subjecting the glass substrate 2 to an etching process after the developing process, and a removing unit HU for removing an unnecessary film portion from the glass substrate 2 after the etching process. The etching unit EU and the removing unit HU have transportation roller portion 42 for transporting a glass substrate 2 only in the +X direction and transportation roller portion 43 for transporting a glass substrate 2 only in the −X direction, respectively, like the developing unit GU and the cleaning unit SU.

The transportation roller portions 40, 41, 42 and 43 respectively include a plurality of rollers, though they are schematically illustrated in FIG. 8 as in FIG. 6.

In the patterning apparatus, a third transportation path 45 having a third transportation robot 44 is provided adjacent to the second unit portion 8 on the +X side thereof. The third transportation path 45 serves to transport a glass substrate 2 subjected to the etching process by the etching unit EU to the removing unit HU.

Thus, a processing unit adapted to treat a glass substrate 2 while transporting the glass substrate 2 in the X direction can be provided in the unit portion 7 or 8.

Figure 9:
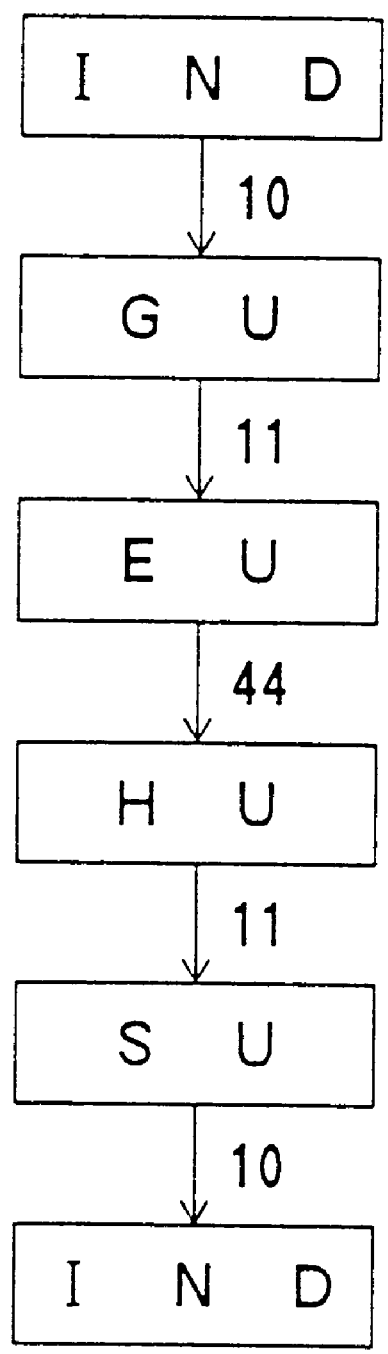
FIG. 9 is a flow chart for explaining the flow of the operation of the patterning apparatus.

FIG. 9 is a flow chart for explaining the operation of the patterning apparatus. A cassette 3 retaining glass substrates subjected to the exposure process is transported to this patterning apparatus. The first transportation robot 10 carries one of the glass substrates 2 out of the cassette 3 on the indexer (IND) 4, and then carries the glass substrate 2 into the developing unit GU. The glass substrate 2 is subjected to the developing process while being transported in the +X direction by the transportation roller portion 40. Thus, an unnecessary photoresist portion is selectively removed from the glass substrate 2.

The glass substrate 2 transported to the downstream end of the developing unit GU is carried out of the developing unit GU into the etching unit EU by the second transportation robot 11. The glass substrate 2 is subjected to the etching process while being transported in the +X direction by the transportation roller portion 42. Thus, an unnecessary metal film portion is selectively removed from the glass substrate 2.

The glass substrate 2 transported to the downstream end of the etching unit EU is carried out of the etching unit EU into the subsequent removing unit HU by the third transportation robot 44. The glass substrate 2 is subjected to the removing process while being transported in the −X direction by the transportation roller portion 43. Thus, a residual photoresist portion is removed from the glass substrate 2.

The glass substrate 2 transported to the downstream end of the removing unit HU is carried out of the removing unit HU into the cleaning unit SU by the second transportation robot 11. The glass substrate 2 is subjected to the cleaning process while being transported in the −X direction by the transportation roller portion 41. Thus, residual film pieces and the like are completely removed from the glass substrate 2.

The glass substrate 2 transported to the downstream end of the cleaning unit SU is carried out of the cleaning unit SU and transported to the front of the original cassette 3 by the first transportation robot 10, and returned to the cassette 3.

This operation flow is merely illustrative, and may be modified as required.

Figure 10:
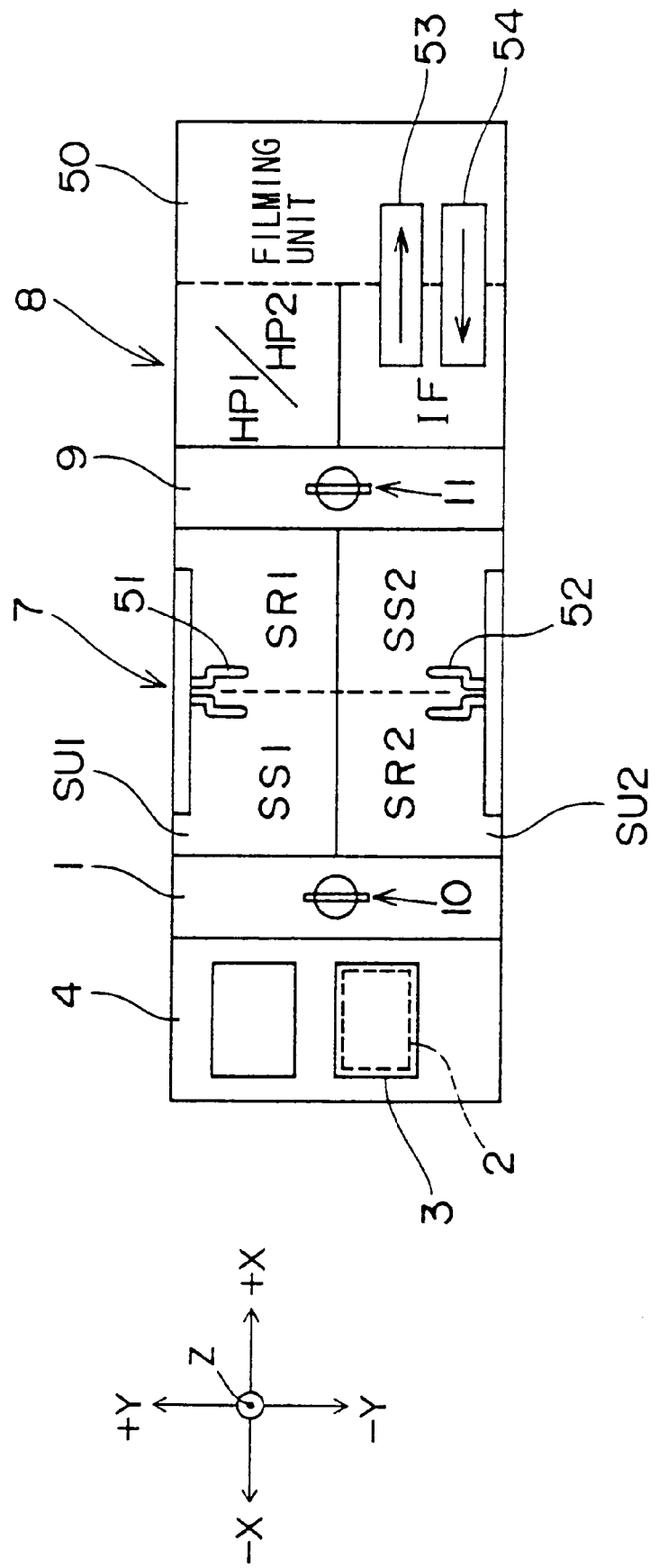
FIG. 10 is a plan view schematically illustrating the construction of a filming system in accordance with a sixth embodiment of the present invention.

FIG. 10 is a plan view schematically illustrating the construction of a filming system in accordance with a sixth embodiment of the present invention. In FIG. 10, like reference characters used in FIG. 1 denote like functional components.

The filming system is adapted to subject a glass substrate 2 to a metal film formation process by sputtering or CVD (chemical vapor deposition). In the filming system, processing units for cleaning a glass substrate 2 before and after the metal film formation process are respectively provided in the first unit portion 7 and the second unit portion 8, and a filming unit 50 is provided on the +X side of the second unit portion 8.

The first unit portion 7 has a cleaning unit SU1 including a spin scrubber SS1 and a spin dryer SR1, and a cleaning unit SU2 including a spin scrubber SS2 and a spin dryer SR2. Special arms 51 and 52 are provided between the spin scrubber SS1 and the spin dryer SR1 and between the spin scrubber SS2 and the spin dryer SR2, respectively, for reciprocal movement in the X direction.

The second unit portion 8 includes heater units HP1 and HP2 which are stacked one on the other, and a load unit IF.

Transportation roller portion 53 for transporting a glass substrate 2 in the +X direction and transportation roller portion 54 for transporting a glass substrate 2 in the −X direction are provided between the load unit IF and the filming unit 50. The transportation roller portions 53 and 54 respectively include a plurality of rollers, though they are schematically illustrated in FIG. 10.

Thus, the processing units are not necessarily arranged generally parallel to the robot transportation direction, but may be partly arranged in a direction different from the robot transportation direction. More specifically, in the first unit portion 7, the arrangement of the spin scrubber SS1 and the spin dryer SR1 and the arrangement of the spin scrubber SS2 and the spin dryer SR2 are perpendicular to the transportation direction in which a glass substrate is transported by the transportation robot 10 or 11.

It is noted that units for performing any other processes may be employed instead of the filming unit 50. In such a case, the units may be arranged in any of various configurations, for example, in an L configuration with an L-shaped transportation path or in a T configuration with a T-shaped transportation path. In the L-configuration unit arrangement, for example, a transportation path extending in the Y direction is provided on the +X side of the second processing unit portion 8, and a plurality of processing units are linearly arranged in the X direction on the +X side of the transportation path with another transportation path provided along the arrangement of the processing units. In the T-configuration unit arrangement, for example, a transportation path extending in the Y direction is provided on the +X side of the second processing unit portion 8, and processing units divided into two groups are linearly arranged in the X direction in parallel with another transportation path disposed between the two groups of linearly arranged processing units.

Figure 11:
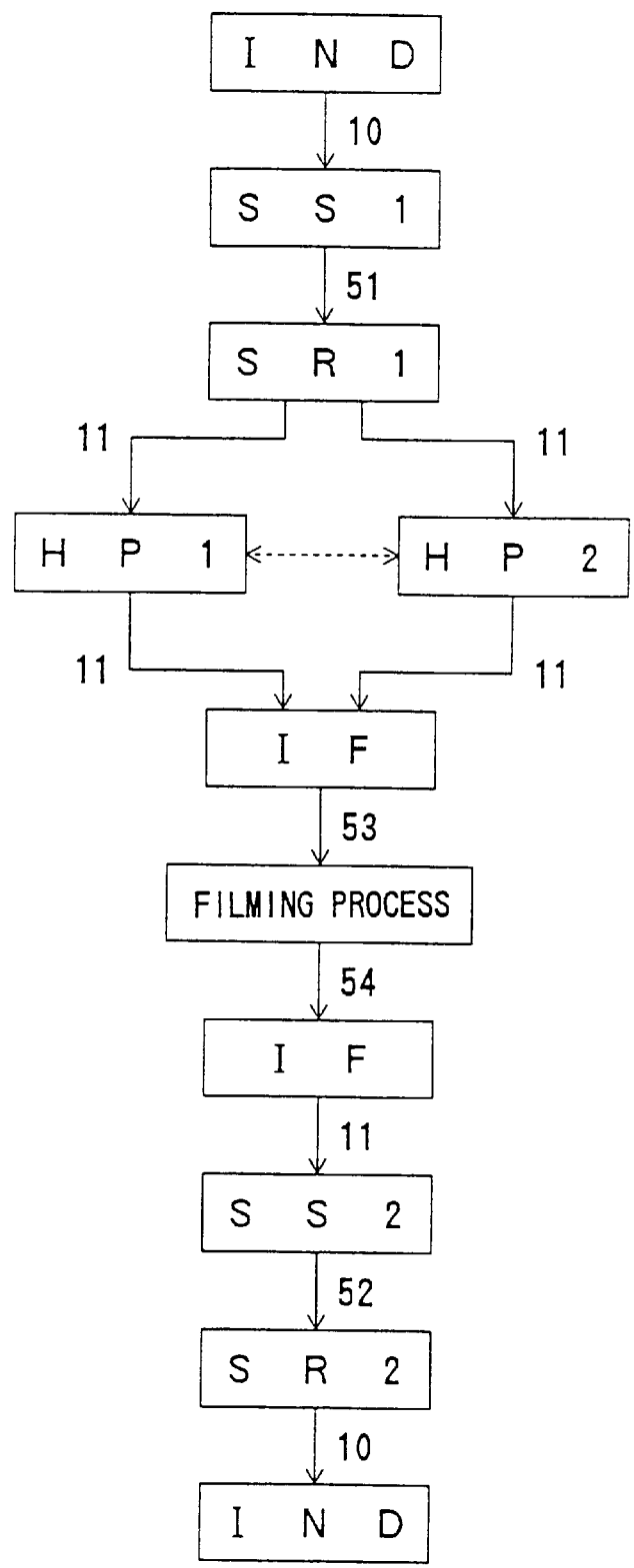
FIG. 11 is a flow chart for explaining the flow of the operation of the filming system.

FIG. 11 is a flow chart for explaining the flow of the operation of the filming system. In the filming system, a glass substrate 2 is first cleaned by the cleaning unit SU1. More specifically, the first transportation robot 10 carries a glass substrate 2 out of a cassette 3 on the indexer (IND) 4 into the spin scrubber SS1. After the glass substrate 2 is washed with water by the spin scrubber SS1, the glass substrate 2 is transferred to the spin dryer SR1 by the special arm 51 and dried. The dried glass substrate 2 is carried out of the spin dryer SR1 into either one of the heater units HP1 and HP2 by the second transportation robot 11, and heated. Thus, the cleaning process prior to the filming process is completed.

Thereafter, the glass substrate 2 is carried out of the heater unit HP1 or HP2 and transported to the front of the load unit IF by the transportation robot 11, and then placed on the upstream end of the transportation roller portion 53. As a result, the glass substrate 2 is automatically carried into the filming unit 50.

The glass substrate 2 formed with a metal film by the filming unit 50 is placed on the upstream end of the transportation roller portion 54. As a result, the glass substrate 2 is automatically carried into the load unit IF. Thereafter, the glass substrate 2 is carried into the spin scrubber SS2 by the second transportation robot 11 and washed with water. Then, the glass substrate 2 is transferred to the spin dryer SR2 by the special arm 52, and dried. Thus, the cleaning process after the filming process is completed.

After the cleaning process, the glass substrate 2 is carried out of the spin dryer SR2 and transported to the front of the original cassette 3 by the first transportation robot 10, and then returned to the cassette 3.

This operation flow is merely illustrative, and may be modified as required.

Figure 12:
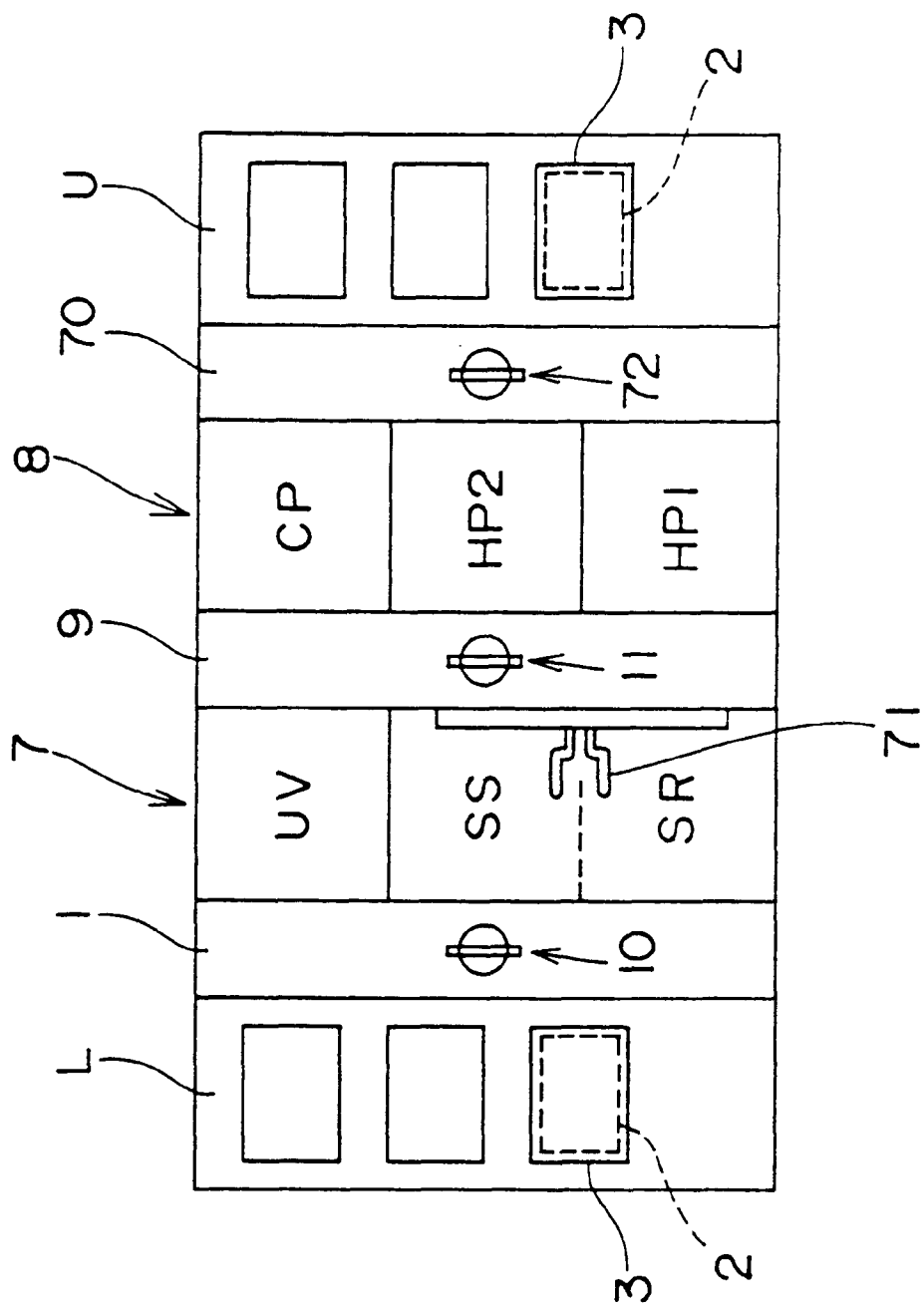
FIG. 12 is a plan view schematically illustrating the construction of a cleaning apparatus in accordance with a seventh embodiment of the present invention.

FIG. 12 is a plan view schematically illustrating the construction of a cleaning apparatus in accordance with a seventh embodiment of the present invention. In FIG. 12, like reference characters used in FIG. 1 denote like functional components.

The substrate processing apparatus is constructed such that untreated glass substrates 2 and treated glass substrates 2 are retained in different cassettes placed in different locations. Unlike the apparatuses according to the first to sixth embodiments, the substrate processing apparatus of the seventh embodiment is not of a uni-cassette type adapted to return a treated glass substrate 2 to a cassette 3 in which the glass substrate is originally retained before the process. The substrate processing apparatus of this arrangement is preferably applicable to the following case.

Figure 13:
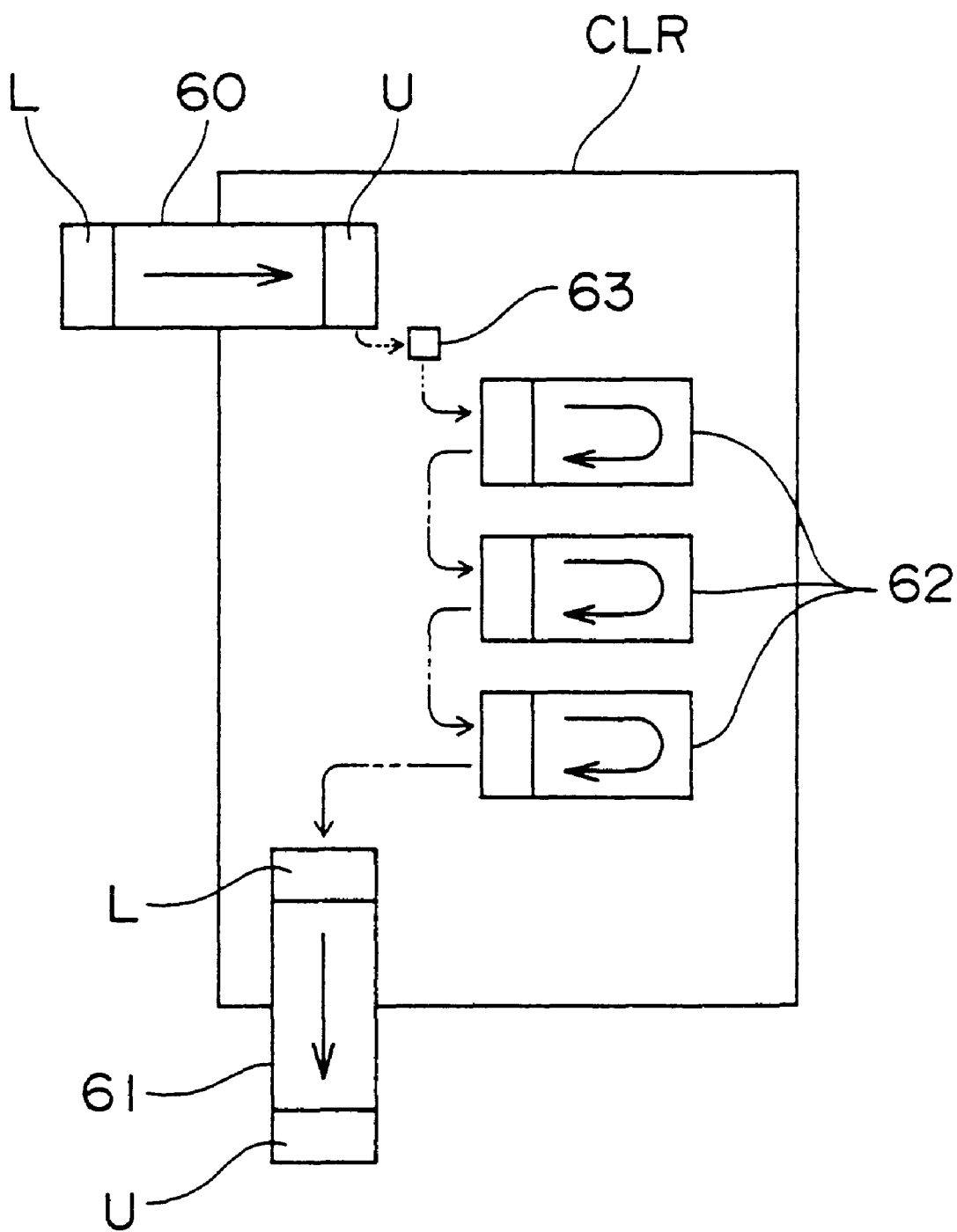
FIG. 13 is a diagram illustrating the installation of the substrate processing apparatus according to the seventh embodiment.

FIG. 13 is a plan view illustrating the installation of substrate processing apparatuses. The processes for glass substrates 2 are typically performed in a clean room CLR to avoid the influences of floating particles in the air on the glass substrates 2. In consideration of the generation of floating particles, the transportation of the glass substrates 2 into the clean room CLR is preferably automated. Likewise, the transportation of the glass substrates 2 out of the clean room CLR after the processes is preferably automated.

A substrate processing apparatus 60 having a loader L for substrate ejection and an unloader U for substrate storage on opposite sides thereof is installed in such a manner that the loader L and the unloader U thereof are disposed outside and inside the clean room CLR, respectively. A substrate processing apparatus 61 having a loader L and an unloader U on opposite sides thereof is installed in such a manner that the unloader U and the loader L thereof are disposed inside and outside the clean room CLR, respectively. A substrate processing apparatus 62 of the uni-cassette type is installed in the clean room CLR. Cassettes 3 are transported between the substrate processing apparatuses 60, 61 and 62 by means of an AGV 63.

With this arrangement, the processing of the glass substrates 2 can be achieved without entrance of a person into the clean room CLR. Therefore, there is no need to consider the generation of particles due to entrance of a person. Thus, the quality of the glass substrates 2 can properly be maintained.

Referring to FIG. 12, the construction of the substrate processing apparatus of the seventh embodiment will be described. The substrate processing apparatus is adapted to clean a glass substrate 2. A loader L to be loaded with cassettes 3 for holding untreated glass substrates 2 and an unloader U to be loaded with a cassette 3 for storing treated glass substrates 2 are disposed on the +X and −X sides of the apparatus.

A first transportation path 1, a first unit portion 7, a second transportation path 9, a second unit portion 8 and a third transportation path 70 are arranged in the X direction between the loader L and the unloader U. In the first unit portion 7, an ultraviolet radiation unit UV, a spin scrubber SS and a spin dryer SR are arranged in the Y direction. In the second unit portion 8, a cooler unit CP, heater units HP1 and HP2 are arranged in the Y direction.

The flow of the operation of the substrate processing apparatus will briefly be described. A glass substrate 2 is carried out of the cassette 3 placed on the loader L into the ultraviolet radiation unit UV by the first transportation robot 10, and dry-cleaned. In turn, the glass substrate 2 is carried into the spin scrubber SS, and washed with water. Then, the glass substrate 2 is carried into the spin dryer SR by a special arm 71, and dried. The glass substrate 2 is carried out of the spin dryer SR into either one of the heater units HP1 and HP2 by a second transportation robot 11, and heated. Then, the glass substrate 2 is carried into the cooler unit CP, and cooled. The glass substrate 2 is carried out of the cooler unit CP by a third transportation robot 72, and inserted into one of the cassettes 3 placed on the unloader U.

This operation flow is merely illustrative, and may be modified as required.

Figure 14:
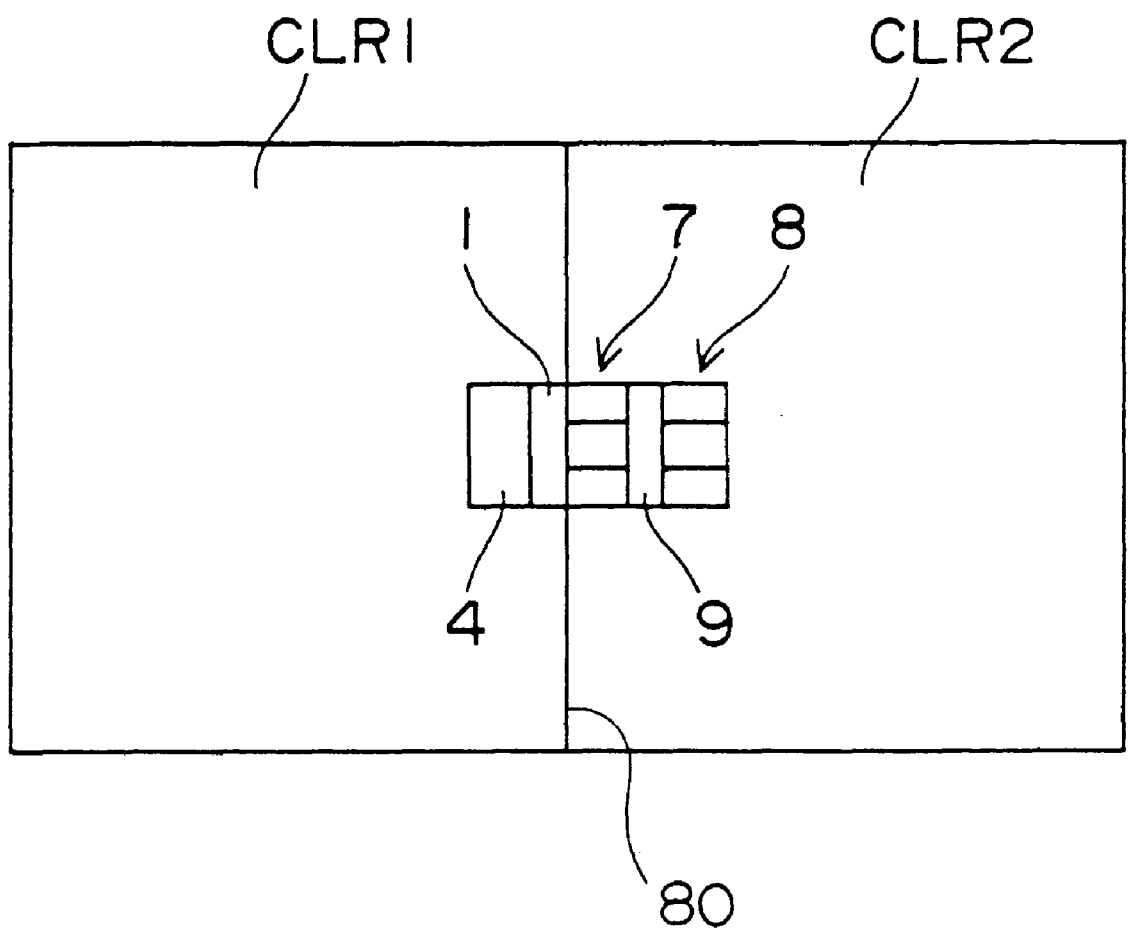
FIG. 14 is a diagram illustrating the installation of a substrate processing apparatus in accordance with an eighth embodiment of the present invention.
Figure 15:
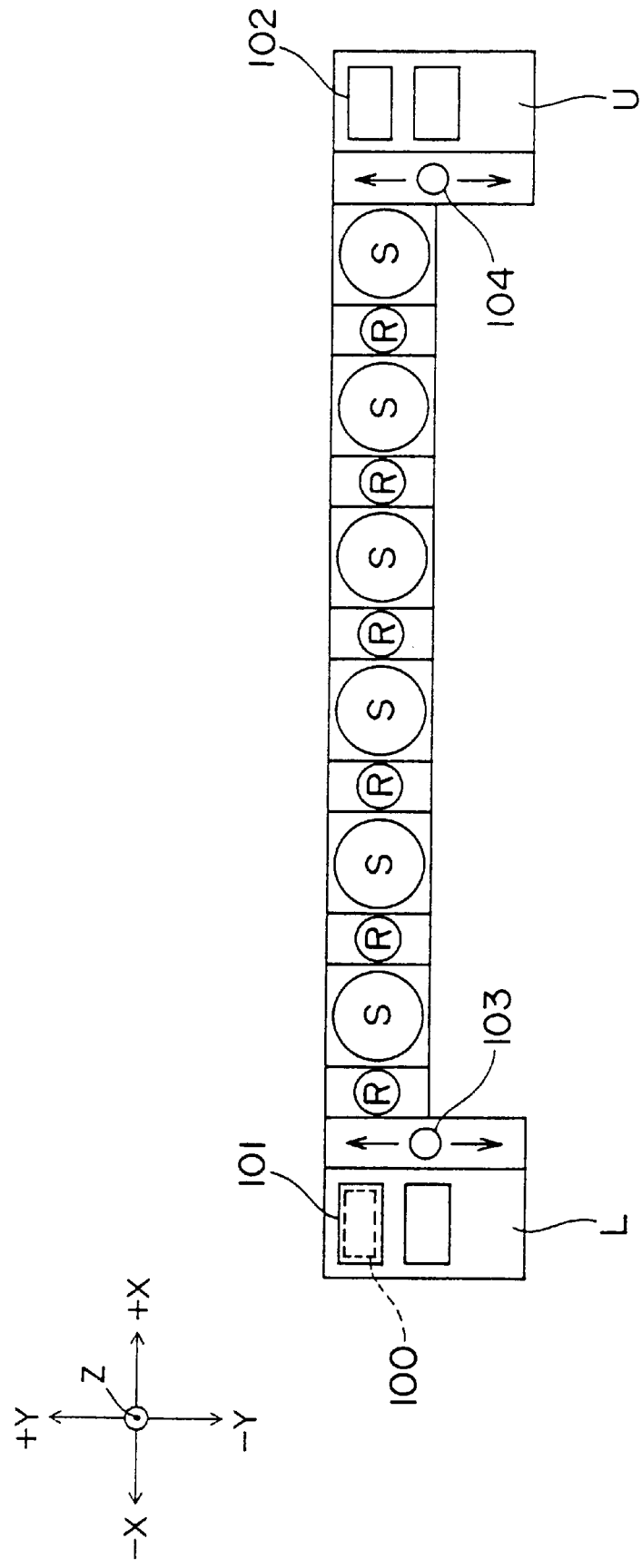
FIG. 15 is a diagram illustrating a prior-art substrate processing apparatus of a sequential arrangement type.

FIG. 14 is a plan view illustrating the installation of a substrate processing apparatus in accordance with an eighth embodiment of the present invention. In FIG. 14, like reference characters used in FIG. 1 denote like functional components.

The substrate processing apparatus is installed so as to extend over two clean rooms CLR1 and CLR2. More specifically, the substrate processing apparatus is installed with its indexer 4 and first transportation path 1 being located in the clean room CLR1 and with its first unit portion 7, second transportation path 9 and second unit portion 8 being located in the clean room CLR2.

With this arrangement, a separator wall 80 separating the clean room CLR1 and CLR2 from each other is located between the indexer 4 and the first and second processing unit portions 7 and 8. This assuredly prevents the indexer 4 from being influenced by any processes performed on a glass substrate 2 in the first unit portion 7 and the second unit portion 8. Therefore, the quality of glass substrates 2 held in the cassettes 3 on the indexer 4 can be maintained at a very high level. The wall 80 is formed with a carry-in/carry-out port having dimensions sufficient and necessary for carrying a glass substrate 2 out of and into the ultraviolet radiation unit UV in the first processing unit portion 7 by means of the first transportation robot on the transportation path 1.

Even if a small opening of the port is provided between the clean rooms CLR1 and CLR2, intrusion of air from the clean room CLR2 into the clean room CLRL can assuredly be prevented by keeping the clean room CLRL at a positive pressure and the clean room CLR2 at a negative pressure. Thus, the quality of the glass substrates can be maintained at a higher level.

In the foregoing explanation, the wall 80 is provided between the first transportation path 1 and the first unit portion 7. Where all the processing units in the first unit portion 7 perform processes other than the heat treatment and the chemical treatment as in the second and third embodiments, however, the wall 80 for separating the clean rooms may be located between the second transportation path 9 and the second unit portion 8.

Further, the wall 80 for separating the clean rooms may be located between the indexer 4 and the first transportation path 1.

Even where the substrate processing apparatus is entirely installed in a single clean room, the indexer 4 can assuredly be protected from the influences of the heat and the chemical mist by providing a shutter between the indexer 4 and the first transportation path 1, between the first transportation path 1 and the first unit portion 7, between the first unit portion 7 and the second transportation path 9, and/or between the second transportation path 9 and the second unit portion 8. Thus, the quality of the glass substrates 2 can be maintained at a higher level.

Although the present invention has been described by way of the embodiments thereof, it is noted that these embodiments in no way limit the present invention. In the foregoing embodiments, the present invention is applied to the substrate processing apparatuses for processing LCD glass substrates. The invention is, of course, applicable to substrate processing apparatuses for processing PDP glass substrates and semiconductor wafers.

While the present invention has been described in detail by way of the embodiment thereof, it should be understood that the foregoing disclosure is merely illustrative of the technical principles of the present invention but not limitative of the same. The spirit and scope of the present invention are to be limited only by the appended claims.

This application claims priority benefits of Japanese Patent Application No. 8-170204 filed in the Japanese Patent Office on Jun. 28, 1996, the entire disclosure thereof being incorporated herein by reference.

What is claimed is:

1. A substrate processing apparatus, comprising:

a first transportation mechanism movable along a first transportation path in a predetermined transportation direction and capable of performing a substrate transferring operation at any of plural points on the first transportation path;

a cassette load portion provided on one side of the first transportation path and adapted to be loaded with a cassette for holding a substrate;

a plurality of unit portions arranged in a direction crossing the transportation direction on the other side of the first transportation path, each of the unit portions including a processing unit for subjecting a substrate to a predetermined process; and a second transportation mechanism disposed between two adjacent ones of said unit portions, the second transportation mechanism being movable along a second transportation path in the transportation direction and capable of performing a substrate transferring operation at any of plural points on the second transportation path;

wherein the first transportation mechanism can perform the substrate transferring operation with respect to the cassette on the cassette load portion and a processing unit in a unit portion disposed in closest proximity to the first transportation path among the plurality of unit portions;

wherein the second transportation mechanism can perform the substrate transferring operation with respect to any processing units included in unit portions disposed on opposite sides of the second transportation path.

2. A substrate processing apparatus as set forth in claim 1, wherein at least one unit portion includes a plurality of processing units arranged in the transportation direction.

3. A substrate processing apparatus as set forth in claim 1, wherein the first and second transportation paths each have an end open to a space outside the substrate processing apparatus.

4. A substrate processing apparatus as set forth in claim 1, further comprising:

a cassette storage portion disposed on a distal side, with respect to the cassette load portion, of a unit portion which is most distant from the cassette load portion among the plurality of unit portions, and adapted to be loaded with a cassette for storing a substrate; and a third transportation mechanism disposed between the most distant unit portion and the cassette storage portion, the third transportation mechanism being movable along a third transportation path in the transportation direction and capable of performing a substrate transferring operation with respect to a processing unit included in the most distant unit portion and the cassette placed on the cassette storage portion at any of plural points on the third transportation path.

5. A substrate processing apparatus as set forth in claim 4, wherein the third transportation path has an end open to a space outside the substrate processing apparatus.

6. A substrate processing apparatus as set forth in claim 1, wherein at least one of the plurality of unit portions includes a load unit on which a substrate is to be temporarily placed.

7. A substrate processing apparatus as set forth in claim 1, wherein the plurality of unit portions include a proximal unit portion disposed in closest proximity to the cassette load portion, and a heat treatment unit portion disposed in a position more distant from the cassette load portion than the proximal unit portion and including a heat treatment unit for subjecting a substrate to a heat treatment.

8. A substrate processing apparatus as set forth in claim 1, wherein the plurality of unit portions include a proximal unit portion disposed in closest proximity to the cassette load portion, and a chemical treatment unit portion disposed in a position more distant from the cassette load portion than the proximal unit portion and including a chemical treatment unit for subjecting a substrate to a chemical treatment.

9. A substrate processing apparatus as set forth in claim 1, further comprising a screening mechanism for preventing the cassette load portion from being influenced by an environmental change which may occur when a substrate is subjected to a process in a processing unit in any of the unit portions.

10. A substrate processing apparatus as set forth in claim 9, wherein the screening mechanism includes a screening plate member disposed in any position between the cassette load portion and a unit portion which includes a specific processing unit.

11. A substrate processing apparatus as set forth in claim 10, wherein the screening plate member is a partition wall partitioning a chamber in which the substrate processing apparatus is installed.

12. A substrate processing apparatus as set forth in claim 10, wherein the specific processing unit is a heat treatment unit.

13. A substrate processing apparatus as set forth in claim 10, wherein the specific processing unit is a chemical treatment unit.

14. A substrate processing apparatus as set forth in claim 1, wherein said first and second transportation mechanisms each temporarily hold a substrate.

15. A substrate processing apparatus, comprising:

a first transportation mechanism moveable along a first transportation path;

a cassette loading portion provided on one side of said first transportation path and adapted to hold at least one cassette holding a plurality of substrates;

a first group of substrate processing units located on the other side of said first transportation path, each substrate processing unit of said first group being adapted to perform a respective substrate process and being located at a different point along said first transportation path;

said first transportation mechanism being capable of transferring substrates between a cassette located in said cassette loading portion and at least one of said first substrate processing units;

a second transportation mechanism moveable along a second transportation path which is generally parallel to said first transportation path, said group of first substrate processing units being located on one said of said second transportation path;

a second group of substrate processing units located on the other side of said second transportation path, each of said substrate processing units of said second group being adapted to perform a respective substrate process and being located at a different point along said second transportation path;

said second transportation mechanism being capable of transferring substrates between at least one of said substrate processing units of said first group and any of said substrate processing units of said second group.

* * * * *